(12) United States Patent
Huang et al.

(10) Patent No.: US 10,204,795 B2
(45) Date of Patent: *Feb. 12, 2019

(54) FLOW DISTRIBUTION PLATE FOR SURFACE FLUORINE REDUCTION

(71) Applicant: Applied Materials, Inc., Santa Clara, CA (US)

(72) Inventors: Jiayin Huang, Fremont, CA (US); Lin Xu, Fremont, CA (US); Zhijun Chen, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/096,428

(22) Filed: Apr. 12, 2016

(65) Prior Publication Data

US 2017/0229309 A1 Aug. 10, 2017

Related U.S. Application Data

(60) Provisional application No. 62/308,413, filed on Mar. 15, 2016, provisional application No. 62/291,299, filed on Feb. 4, 2016.

(51) Int. Cl.
| | |
|---|---|
| *H01L 21/00* | (2006.01) |
| *C23C 16/00* | (2006.01) |
| *H01L 21/3065* | (2006.01) |
| *H01J 37/32* | (2006.01) |
| *H01L 21/67* | (2006.01) |

(52) U.S. Cl.
CPC .... *H01L 21/3065* (2013.01); *H01J 37/32009* (2013.01); *H01J 37/3244* (2013.01); *H01J 37/32715* (2013.01); *H01L 21/67069* (2013.01); *H01J 2237/334* (2013.01)

(58) Field of Classification Search
USPC ................................. 156/345.35; 118/723 ER
See application file for complete search history.

(56) References Cited

U.S. PATENT DOCUMENTS

| | | | | |
|---|---|---|---|---|
| 6,083,363 | A * | 7/2000 | Ashtiani | H01J 37/321 204/298.01 |
| 6,450,117 | B1 * | 9/2002 | Murugesh | C23C 16/4402 118/723 ER |
| 6,761,796 | B2 * | 7/2004 | Srivastava | H01J 37/32192 118/723 ER |

(Continued)

*Primary Examiner* — Parviz Hassanzadeh
*Assistant Examiner* — Michelle Crowell
(74) *Attorney, Agent, or Firm* — Patterson + Sheridan, LLP (57) ABSTRACT

A method and apparatus for processing a semiconductor substrate are described herein. A process system described herein includes a plasma source and a flow distribution plate. A method described herein includes generating fluorine radicals or ions, delivering the fluorine radicals or ions through one or more plasma blocking screens to a volume defined by the flow distribution plate and one of one or more plasma blocking screens, delivering oxygen and hydrogen to the volume, mixing the oxygen and hydrogen with fluorine radicals or ions to form hydrogen fluoride, flowing hydrogen fluoride through the flow distribution plate, and etching a substrate using bifluoride. The concentration of fluorine radicals or ions on the surface of the substrate is reduced to less than about two percent.

16 Claims, 4 Drawing Sheets

(56) References Cited

U.S. PATENT DOCUMENTS

| | | | |
|---|---|---|---|
| 6,830,624 B2 * | 12/2004 | Janakiraman | C23C 16/4405 118/715 |
| 7,520,957 B2 * | 4/2009 | Kao | H01J 37/32082 118/723 DC |
| 9,349,605 B1 * | 5/2016 | Xu | H01L 21/31116 |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 2004/0144490 A1 * | 7/2004 | Zhao | C23C 16/4405 156/345.47 |
| 2009/0183833 A1 * | 7/2009 | Kim | C23C 16/452 156/345.33 |
| 2012/0115314 A1 * | 5/2012 | Sakamoto | C23C 16/24 438/479 |
| 2012/0122302 A1 * | 5/2012 | Weidman | C23C 16/325 438/478 |
| 2013/0153148 A1 * | 6/2013 | Yang | C23C 16/45565 156/345.34 |
| 2014/0154889 A1 * | 6/2014 | Wang | H01L 21/32136 438/720 |
| 2014/0227881 A1 * | 8/2014 | Lubomirsky | H01J 37/32357 438/710 |
| 2015/0167160 A1 * | 6/2015 | Chen | C23C 16/452 427/58 |
| 2015/0214067 A1 * | 7/2015 | Zhang | H01J 37/32422 438/724 |
| 2015/0221479 A1 * | 8/2015 | Chen | H01J 37/32422 156/345.29 |
| 2015/0249018 A1 | 9/2015 | Park et al. | |
| 2015/0311089 A1 | 10/2015 | Kim et al. | |
| 2015/0371866 A1 | 12/2015 | Chen et al. | |
| 2015/0376788 A1 * | 12/2015 | Zhou | C23C 16/45574 118/723 R |
| 2015/0380218 A1 * | 12/2015 | Tan | H01J 37/32357 156/345.33 |
| 2016/0032451 A1 * | 2/2016 | Kurita | H01J 37/32357 134/1.1 |
| 2016/0086807 A1 * | 3/2016 | Park | H01J 37/32449 428/156 |
| 2016/0104606 A1 * | 4/2016 | Park | H01J 37/32082 156/345.38 |
| 2016/0104648 A1 * | 4/2016 | Park | H01J 37/32082 438/9 |
| 2016/0217981 A1 * | 7/2016 | Nguyen | H01J 37/3244 |
| 2017/0018411 A1 | 1/2017 | Sriraman et al. | |
| 2017/0062184 A1 * | 3/2017 | Tran | H01J 37/3244 |
| 2017/0069462 A1 | 3/2017 | Kanarik et al. | |
| 2017/0069466 A1 * | 3/2017 | Tran | H01J 37/32082 |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0178917 A1 | 6/2017 | Kamp et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |

* cited by examiner

FLOW DISTRIBUTION PLATE FOR SURFACE FLUORINE REDUCTION

CROSS-REFERENCE TO RELATED APPLICATIONS

This application claims benefit of U.S. Provisional Patent Application Ser. No. 62/291,299, filed Feb. 4, 2016, and U.S. Provisional Patent Application Ser. No. 62/308,413, filed Mar. 15, 2016, each of which is herein incorporated by reference.

BACKGROUND OF THE INVENTION

Field of the Disclosure

The present disclosure generally relates to a method for processing semiconductor substrates. More specifically, embodiments of the present disclosure relate to methods for reducing fluorine on a surface of semiconductor substrate using a plasma process system which includes a flow distribution plate.

Description of Related Art

Electronic devices, such as flat panel displays and integrated circuits, are commonly fabricated by a series of processes in which layers are deposited on a surface of a substrate and the deposited material is etched into desired patterns. The processes commonly include physical vapor deposition (PVD), chemical vapor deposition (CVD), plasma enhanced CVD (PECVD), and other plasma processing methods.

One problem encountered during plasma processing is the concentration of fluorine on the substrate surface. The surface fluorine may cause water stains, surface tension during conformal oxide growth, and device leakage.

Traditionally, wet etch processes have been used to reduce surface fluorine. However, wet etch processes have selectivity issues and oftentimes deform the remaining materials. Moreover, wet etch processes have reached their limitation as devices sizes have decreased.

Dry etch processes are often desirable for selectively removing material from semiconductor substrates. The desirability stems from the ability to gently remove material from miniature structures with minimal physical disturbance. Dry etch processes also allow the etch rate to be quickly stopped by removing the gas phase reagents. Some dry-etch processes involve the exposure of a substrate to remote plasma by-products formed from one or more precursors. For example, remote plasma generation of nitrogen trifluoride in combination with ion suppression techniques enables silicon to be selectively removed from a substrate when the plasma effluents are flowed into the substrate processing region.

Thus, methods are needed to reduce fluorine on a substrate surface using dry etch processes.

SUMMARY OF THE INVENTION

In one embodiment, a method for etching a substrate is provided. The method includes delivering a fluorine containing precursor through one or more plasma blocking screens to a volume defined by a flow distribution plate and one of the one or more plasma blocking screens, delivering an oxygen and hydrogen containing precursor to the volume and mixing the oxygen and hydrogen with the fluorine to form hydrogen fluoride, flowing hydrogen fluoride through the flow distribution plate, and contacting the hydrogen fluoride with a surface of a substrate which reduces fluorine content on the surface.

In another embodiment, a method for etching a substrate is provided. The method includes generating one or more of fluorine radicals or ions, delivering the one or more of fluorine radicals or ions through one or more plasma blocking screens to a volume defined by a flow distribution plate and one of the one or more plasma blocking screens, delivering oxygen and hydrogen to the volume and mixing the oxygen and hydrogen with the one or more of fluorine radicals or ions to form hydrogen fluoride, flowing hydrogen fluoride through the flow distribution plate, and etching a substrate using bifluoride. A concentration of the one or more of fluorine radicals or ions on a surface of the substrate is less than about two percent.

In yet another embodiment, a plasma process system is disclosed. The system includes a remote plasma source, a gas diffuser, a plasma blocking screen disposed below the gas diffuser, a flow distribution plate disposed below the plasma blocking screen, a side precursor channel disposed between the plasma blocking screen and the flow distribution plate, and a substrate support pedestal disposed below the flow distribution plate.

BRIEF DESCRIPTION OF THE DRAWINGS

So that the manner in which the recited features of the present disclosure can be understood in detail, a more particular description of the disclosure may be had by reference to embodiments, some of which are illustrated in the appended drawings. It is to be noted, however, that the appended drawings illustrate only exemplary embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one aspect may be advantageously adapted for utilization in other aspects described herein.

DETAILED DESCRIPTION

Figure 1:
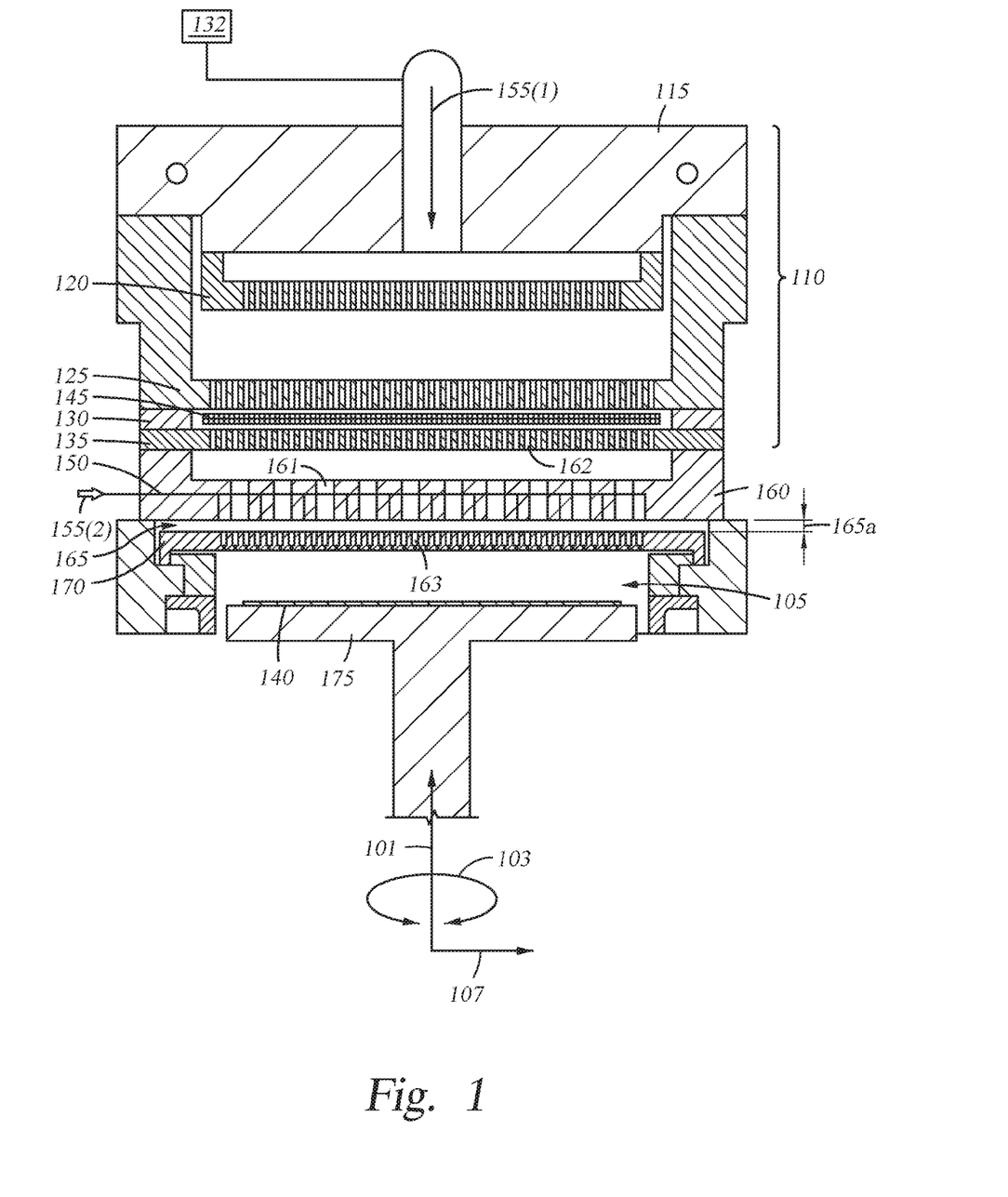
FIG. 1 is a schematic, cross-sectional view of a plasma process system, which can be used to perform methods described herein.

FIG. 1 is a schematic, cross-sectional view of a plasma process system 100, in which embodiments of the disclosure may be practiced. Plasma process system 100 includes a plasma source 110 and a process chamber 105. In the orientation of FIG. 1, a general direction of gas and/or plasma product flow is downwards, and this direction may be referred to as "downstream" herein, while an opposing direction upwards in the orientation of FIG. 1, may be referred to as "upstream." Also, significant portions of the apparatus shown in FIG. 1 may be cylindrically symmetric about a central axis 101, with associated directions being defined as a radial direction 107 and an azimuthal direction 103. This convention of directions may be used herein, although one skilled in the art will understand that many of the principles described herein are not limited to cylindrically symmetric systems.

As shown in FIG. 1, the plasma process system 100 generally includes an RF electrode 115, a first gas diffuser 120, an insulator 130, a face plate 125, a first plasma blocking screen 135, and a flow distribution plate 170. Gases and/or vaporized liquids, such as water, may be introduced to the plasma process system 100 by an upstream source 132, which may be a capacitively coupled plasma source, a remote plasma source, or a water delivery source. The RF electrode 115 is electrically coupled to the first gas diffuser 120 and the face plate 125 that serve to redirect flow of the source gases so that gas flow is uniform across plasma source 110 (uniform from left to right in the view of FIG. 1). It should be noted that all of the diffusers or screens herein may be characterized as electrodes, as any such diffusers or screens may be tied to a particular electrical potential. The insulator 130, in one aspect a ceramic ring, electrically insulates the RF electrode 115, including the face plate 125, from the first plasma blocking screen 135 that is held at electrical ground. The first plasma blocking screen 135 serves as plasma product (i.e. radical/ion) blocker and as a second electrode counterfacing face plate 125 of the RF electrode 115.

Plasma products generated in plasma 145 pass through the first plasma blocking screen 135. Upon passing through the first plasma blocking screen 135, the plasma products pass through an optional second plasma blocking screen 160 that promotes uniformity of an etchant precursor across the aerial surface of substrate 140. The second plasma blocking screen 160 may be configured as a dual channel showerhead. The second plasma blocking screen 160 is also held at electrical ground. Apertures 161 that pass completely through the second plasma blocking screen 160 are of a diameter at least three times a diameter of apertures 162 formed through the first plasma blocking screen 135. Also, the second plasma blocking screen 160 includes further channels 150 that may be used to introduce oxygen and hydrogen to the plasma products as they enter volume 165 (that is, one or more oxygen and/or hydrogen containing precursors 155(2) emerge only from a side of the second plasma blocking screen 160 that is distal to a first plasma blocking screen 135). The volume 165 is defined by a one of the one or more plasma blockings screens (two are shown as 135, 160) and the flow distribution plate 170. The volume 165 may have a distance 165a of about 0.05 inches and about 1 inch, such as about 0.46 inches. As shown in FIG. 1, the distance 165a is defined as extending between the downstream surface of the second plasma blocking screen 160 and the upstream surface of the flow distribution plate 170.

Gases 155(1), precursor 155(2) and/or plasma products from plasma 145 enter the volume 165, and then pass through a flow distribution plate 170 to process chamber 105. The flow distribution plate 170 may be between about 0 millimeters (mm) and about 6,000 mm away from the second plasma blocking screen 160. In other words, the flow distribution plate 170 may be immediately below or spaced a distance 165a away from the second plasma blocking screen 160. Flow distribution plate 170 may have a thickness in the range of about 0.15 inches to about 1.0 inches, such as about 0.45 inches. Many small apertures 163 are formed through the flow distribution plate 170. The small apertures 163 allow gases and plasma products from upstream sources to pass through the flow distribution plate 170 and into process chamber 105, while substantially blocking downstream plasmas and plasma products from reaching upstream components, as discussed in detail below. The apertures 163 of the flow distribution plate 170 are smaller than the apertures 161 of the second plasma blocking screen 160 in order to provide greater flow restraint through the flow distribution plate 170 relative to the second plasma blocking screen 160. Like the second plasma blocking screen 160, the flow distribution plate 170 is also held at electrical ground. The gases exiting the flow distribution plate 170 interact with substrate 140 disposed on the pedestal 175 within the process chamber 105.

Figure 2:
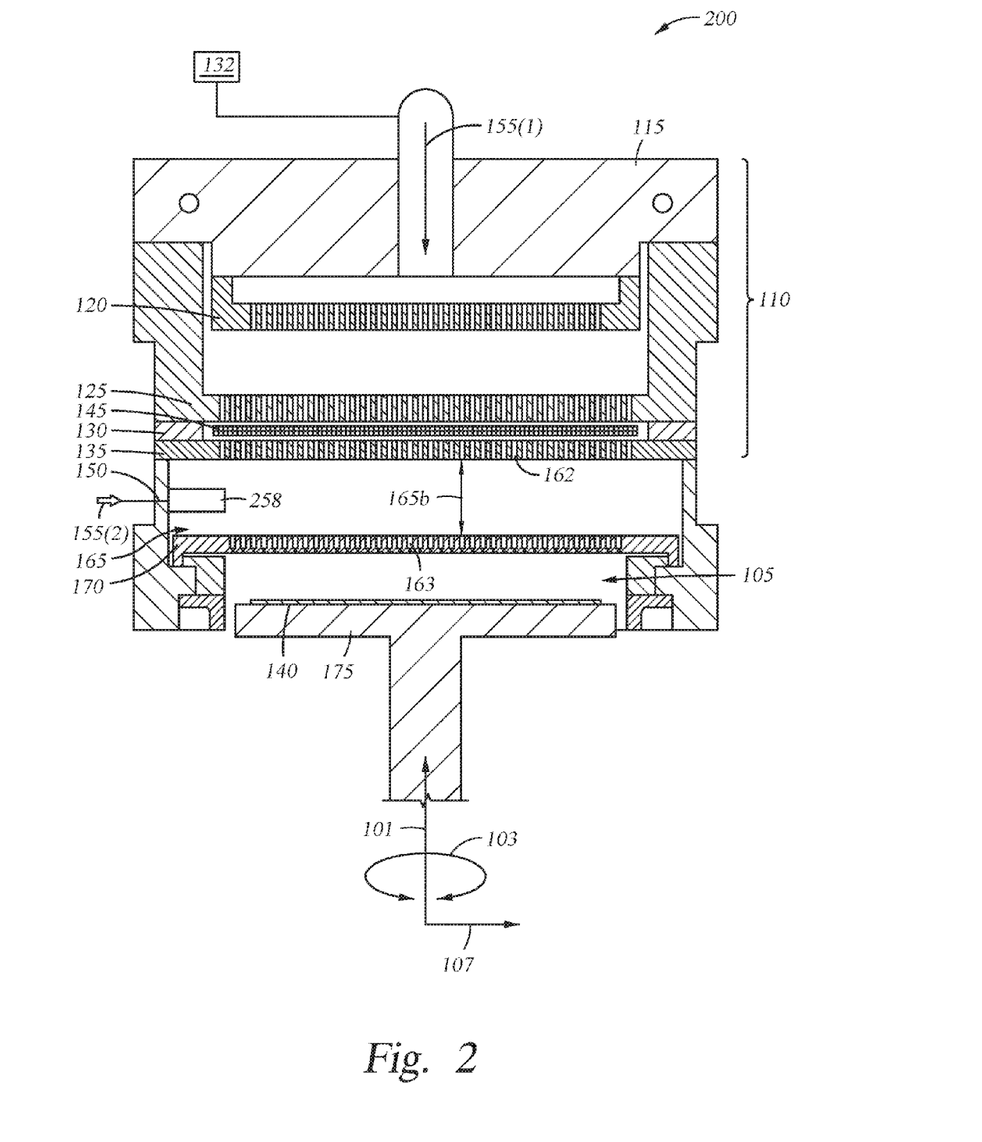
FIG. 2 is a schematic, cross-sectional view of a plasma process system, which can be used to perform methods described herein.

FIG. 2 is a schematic view of a plasma process system 200, which can also be used practice methods described herein. The plasma process system 200 is similar to the plasma process system 100 of FIG. 1, except that plasma process system 200 does not include the second plasma blocking screen 160. By removing the second plasma blocking screen 160, the volume 165 may have a distance 165b, which is greater than the distance 165a of the volume 165 of plasma process system 100. The distance 165b is defined as extending from the downstream surface of one of the one or more plasma blocking screens, specifically the downstream surface of the first plasma blocking screen 135 in FIG. 2, and the upstream surface of the flow distribution plate 170. The increased distance 165b provides for a greater volume to enhance premixing of gases.

Figure 3:
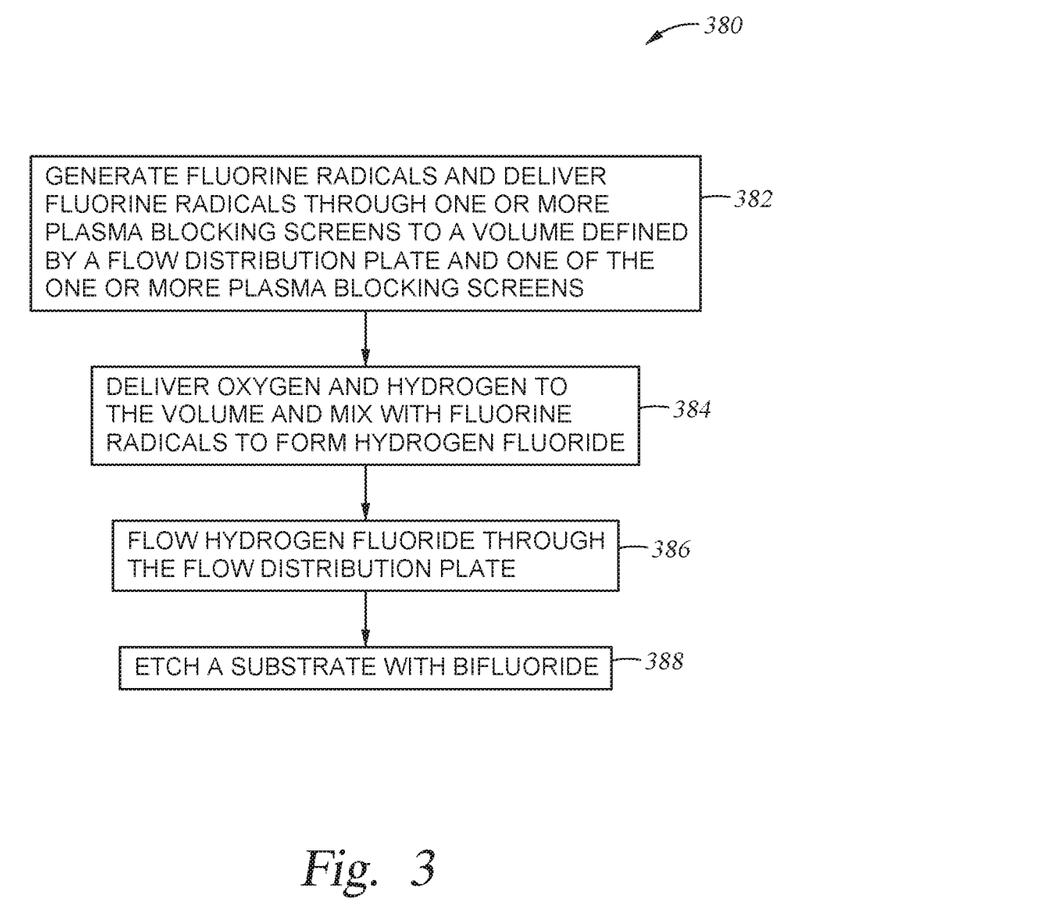
FIG. 3 is a flow diagram of one embodiment of a method for etching a substrate.

FIG. 3 is a flow diagram of one embodiment of a method 380 for etching a substrate. The method 380 reduces the amount of fluorine radicals present on the substrate during etching. At operation 382, fluorine radicals and/or fluorine ions are generated and delivered through one or more plasma blocking screens, 135 and/or 160, to the volume 165 defined by the flow distribution plate 170 and one of the one or more plasma blocking screens 235, 260. The fluorine radicals and/or fluorine ions may be generated the upstream source 132. Suitable precursors for forming the fluorine radical include nitrogen trifluoride ($NF_3$) and the like. Other processing gases, such as helium (He) and/or argon (Ar) gases, may also be utilized to facilitate plasma generation.

In examples where the fluorine radicals and/or fluorine ions are generated by capacitive coupling by the upstream source 132, source powers suitable for plasma generation may be less than about 2000 W, such as between about 25 watts (W) and about 500 W. In examples utilizing an upstream source 132 configured to generate a remote plasma, the source power may be between about 0 kilowatts (kW) and about 10 kW. In examples wherein the upstream source 132 utilizes both capacitive coupling and remote plasma, the temperature of the pedestal 175 may be maintained between about 0° C. and about 100° C., such as between about 8° C. and about 15° C., and the pressure of the processing volume may be maintained between about 0.5 Torr to about 12 Torr.

At operation 384, one or more oxygen and/or hydrogen containing precursors 155(2) are delivered to the volume 165 and mixed with the fluorine radicals and/or fluorine ions to form hydrogen fluoride (HF). It is believed that the fluorine radicals and/or fluorine ions may react with hydrogen provided by the hydrogen containing precursor to form hydrogen fluoride. In one example, the oxygen and hydrogen containing precursor 155(2) may be water ($H_2O$) vapor. In other examples, the oxygen and hydrogen containing precursor 155(2) may be hydroxide (OH), ethanol (EtOH), methanol ($CH_4O$), or isopropyl alcohol ($C_3H_8O$). In other examples, two precursors 155(2) may be used, such as an oxygen containing precursor and a separate hydrogen containing precursor. The amount of oxygen and hydrogen containing precursor delivered to the volume 265 may be less than about 3,000 mg.

At operation 386, hydrogen fluoride is flowed through the flow distribution plate 170. The positive downstream flow, for example, a pressure differential, of the fluorine radicals and/or fluorine ions above the flow distribution plate 170 and gravity help to flow the hydrogen fluoride through the flow distribution plate 170.

A thin layer of oxygen and hydrogen containing precursor solvents may be allowed to form on the surface of a substrate 140. For example, a thin layer of water may be formed through the exposure of the substrate to water vapor or ambient humidity. The ambient humidity within the plasma process system 100, 200 may be controlled using various humidity control apparatuses to selectively modulate the environment in which the substrate 140 is processed. The water layer may be between about 1 and about 5 monolayers thick. The thickness of a monolayer of water may be between about 0.05 nanometers (nm) and about 0.25 nm. The hydrogen fluoride exiting the flow distribution plate 170 reacts with the water layer and ionizes to form bifluoride ($HF_2^-$).

At operation 388, the substrate 140 is etched with a bifluoride etchant, such as $HF_2^-$. The bifluoride etchant predominantly etches surface oxides preferentially to silicon (Si) or silicon nitride (SiN) materials that may be present on the substrate 140, while also attaching to dangling bonds of remaining fluorine ions which may be present on the surface of the substrate 140. By mixing the fluorine radicals and/or fluorine ions with the injected $H_2O$, or other oxygen and hydrogen containing precursor, most or all of the fluorine radicals on the surface of substrate 140 are converted to active etchant. The fluorine concentration on the surface of the substrate 140 may be reduced to less than about 6%. In one example, the fluorine concentration on the surface of the substrate 140 may be reduced to less than about 4%. In another example, the fluorine concentration on the surface of the substrate 140 may be reduced to less than about 2%.

When the method 380 is performed in the plasma process system 100 of FIG. 1, the fluorine radicals and/or fluorine ions are introduced to the system 100 through the upstream source 132, while the one or more oxygen and/or hydrogen containing precursors are introduced through the second plasma blocking screen 160, which is configured as a dual channel showerhead. The temperature at the second plasma blocking screen 160 and flow distribution plate 170 is lower than the upstream temperature such that the water vapor, when $H_2O$ is used as the precursor, is condensed and a thin layer of water forms on the surface of the substrate 140.

When the method 380 is performed in the plasma process system 200 of FIG. 2, the one or more oxygen and/or hydrogen containing precursors 155(2) are delivered into the volume 165, which may be defined by the first plasma blocking screen 135 and the flow distribution plate 170, by a side precursor channel 258.

Figure 4:
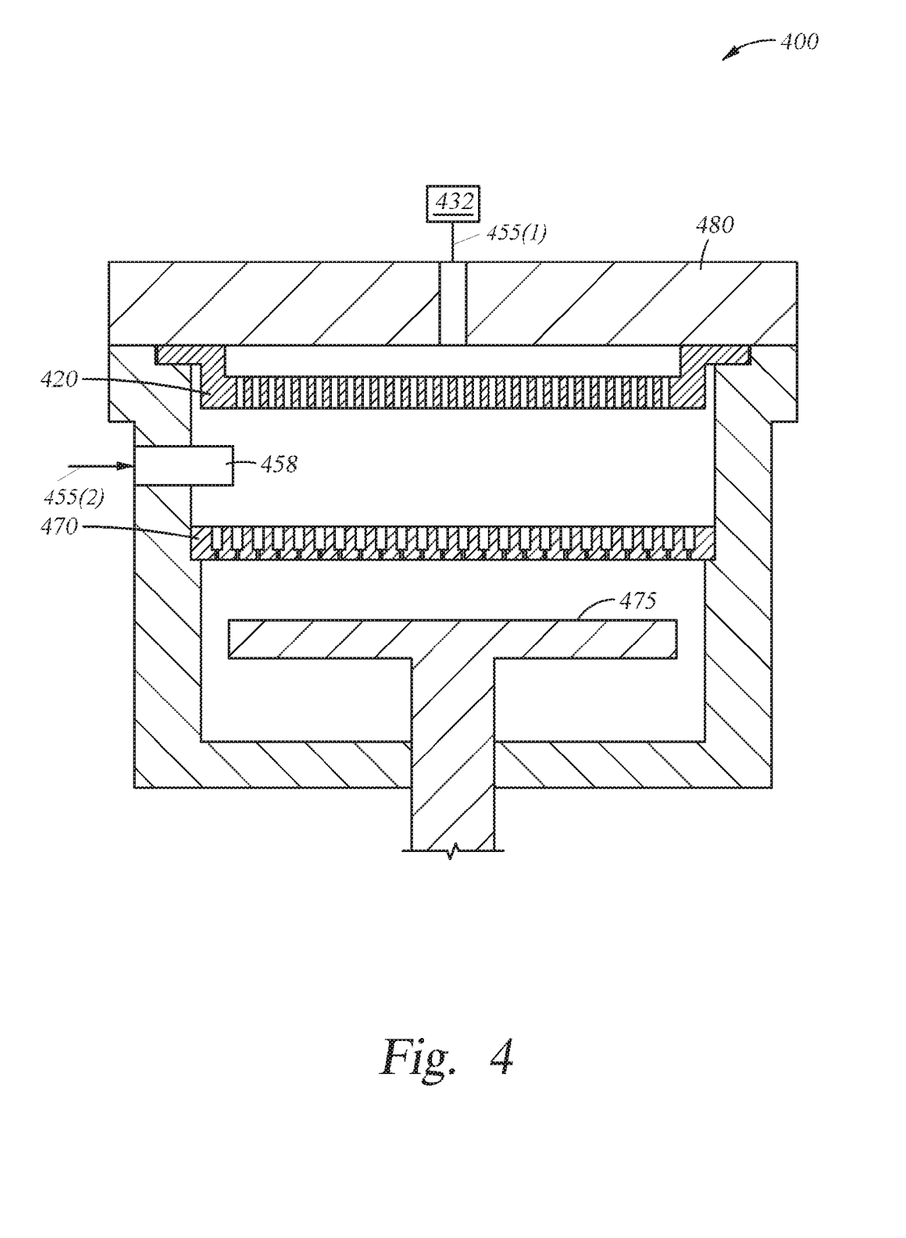
FIG. 4 is a schematic, cross-sectional view of a plasma process system, which can be used to perform methods described herein.

FIG. 4 is a schematic view of a plasma process system 400, which can also be used practice methods described herein. The plasma process system 400 generally includes a gas diffuser plate 420 and a flow distribution plate 470 disposed therein. Gases and/or vaporized liquids 455(1), such as water, may be introduced to the plasma process system 400 by an upstream source 432, which may be a capacitively coupled plasma source, a remote plasma source, or a water delivery source. One or more oxygen and/or hydrogen containing precursors 455(2) are delivered into an upper internal volume of the plasma process system 400, which may be defined by the gas diffuser plate 420, the flow distribution plate 470, and walls of the plasma process system 400. The upper internal volume is positioned adjacent a side precursor channel 458 to receive the one or more oxygen and/or hydrogen containing precursors 455(2) therefrom. The gases or vaporized liquids 455(1), as well as the one or more oxygen and/or hydrogen containing precursors 455(2), or reactants thereof, may flow through the flow distribution plate 470 to interact with a substrate disposed on the pedestal 475. As shown in FIG. 4, the side precursor channel 458 is located below the gas diffuser plate 420. In alternative examples, the side precursor channel 458 may be located above the gas diffuser plate 420.

In further examples, the fluorine radicals and/or fluorine ions and the one or more oxygen and/or hydrogen containing precursors may both be introduced into the plasma processing systems 100, 200 by the upstream source 132.

The examples disclosed herein describe dry etch methods for reducing fluorine content on a substrate surface using a flow distribution plate while increasing etch selectivity. The flow distribution plate creates a pre-mixing volume for fluorine radicals and/or fluorine ions and $H_2O$ vapor in order to reduce redundant fluorine radicals left on a substrate surface, while also maintaining or improving the etch rate.

While the foregoing is directed to embodiments of the present disclosure, other and further embodiments of the disclosure may be devised without departing from the basic scope thereof, and the scope thereof is determined by the claims that follow.

What is claimed is:
1. A plasma process system, comprising:
   a remote plasma source;
   a gas diffuser a face plate disposed below the gas diffuser;
   a face plate disposed below the gas diffuser;
   a first plasma blocking screen disposed below the face plate,
   a plasma formation region defined by the face plate and the first plasma blocking screen;
   a second plasma blocking screen disposed below the first plasma blocking screen;
   a flow distribution plate disposed below the second plasma blocking screen;
   a mixing volume region defined by the flow distribution plate and the second plasma blocking screen;
   a side precursor channel disposed within the second plasma blocking screen above the flow distribution plate; and
   a substrate support pedestal disposed below the flow distribution plate.
2. The system of claim 1, wherein the flow distribution plate is between about 0 millimeters and about 6,000 millimeters below the first plasma blocking screen.
3. The system of claim 1, wherein the flow distribution plate has a thickness of between about 0.15 inches and about 1.0 inches.
4. The system of claim 1, wherein the flow distribution plate is between about 0.05 inches and about 1 inch below the first plasma blocking screen.
5. The system of claim 1, further comprising:
   an RF electrode electrically coupled to the gas diffusor and the face plate; and
   an insulator disposed below the RF electrode and the face plate.
6. The system of claim 5, wherein the insulator is a ceramic ring electrically insulating the RF electrode and the face plate from the first plasma blocking screen.

7. A plasma process system, comprising:
a remote plasma source;
a face plate a face plate disposed below the gas diffuser;
a first plasma blocking screen disposed below the face plate;
a second plasma blocking screen disposed below the first plasma blocking screen;
a flow distribution plate disposed between about 0 millimeters and about 6,000 millimeters below the second plasma blocking screen;
a mixing volume region defined by the flow distribution plate and the second plasma blocking screen;
a side precursor channel disposed within the second plasma blocking screen above the flow distribution plate; and
a substrate support pedestal disposed below the flow distribution plate.

8. The system of claim 7, wherein each of the first plasma blocking screen and the second plasma blocking screen comprises:
a plurality of apertures passing therethrough, and wherein the apertures of the second plasma blocking screen have a diameter at least three times a diameter of the apertures of the first plasma blocking screen.

9. The system of claim 7, wherein the second plasma blocking screen further comprises:
one or more side precursor channels.

10. The system of claim 7, wherein the flow distribution plate comprises:
a plurality of apertures having a diameter less than the apertures of the second plasma blocking screen.

11. The system of claim 7, wherein the flow distribution plate has a thickness of between about 0.15 inches and about 1.0 inches.

12. A plasma process system, comprising:
a remote plasma source;
a gas diffuser a face plate disposed below the gas diffuser;
a first plasma blocking screen disposed below the face plate;
a second plasma blocking screen disposed below the first plasma blocking screen;
a flow distribution plate disposed below the plasma blocking screen, the flow distribution plate having a thickness of between about 0.15 inches and about 1.0 inches;
a mixing volume region defined by the second plasma blocking screen and the flow distribution plate;
a side precursor channel disposed within the second plasma blocking screen above the flow distribution plate; and
a substrate support pedestal disposed below the flow distribution plate.

13. The system of claim 12, wherein each of the first plasma blocking screen and the second plasma blocking screen comprises:
a plurality of apertures passing therethrough, wherein the apertures of the second plasma blocking screen have a diameter at least three times a diameter of the apertures of the first plasma blocking screen.

14. The system of claim 12, wherein the flow distribution plate comprises:
a plurality of apertures having a diameter less than the apertures of the second plasma blocking screen.

15. The system of claim 12, wherein the second plasma blocking screen further comprises:
one or more side precursor channels.

16. The system of claim 12, wherein the flow distribution plate is between about 1 millimeters and about 6,000 millimeters below the second plasma blocking screen, and wherein the flow distribution plate has a thickness of between about 0.15 inches and about 1.0 inches.

* * * * *

UNITED STATES PATENT AND TRADEMARK OFFICE
CERTIFICATE OF CORRECTION

PATENT NO. : 10,204,795 B2  
APPLICATION NO. : 15/096428  
DATED : February 12, 2019  
INVENTOR(S) : Jiayin Huang et al.

Page 1 of 1

It is certified that error appears in the above-identified patent and that said Letters Patent is hereby corrected as shown below:

On the Title Page

Item (57), Line 7, after "of" insert -- the --.

In the Specification

Column 3, Line 11, delete "capactively" and insert -- capacitively --, therefor.

Column 5, Line 64, delete "capactively" and insert -- capacitively --, therefor.

In the Claims

Column 6, Lines 34-35, in Claim 1, delete "diffuser a face plate disposed below the gas diffuser;" and insert -- diffuser; --, therefor.

Column 7, Line 3, Claim 7, delete "a face plate a" and insert -- a gas diffuser; a --.

Column 7, Line 37, Claim 12, after "gas diffuser" insert -- ; --.

Signed and Sealed this  
Twenty-sixth Day of March, 2019

Andrei Iancu  
*Director of the United States Patent and Trademark Office*